United States Patent [19]
Fuller et al.

[11] Patent Number: 5,764,954
[45] Date of Patent: Jun. 9, 1998

[54] METHOD AND SYSTEM FOR OPTIMIZING A CRITICAL PATH IN A FIELD PROGRAMMABLE GATE ARRAY CONFIGURATION

[75] Inventors: Christine Marie Fuller, Williston; Steven Paul Hartman, Jericho; Eric Ernest Millham, St. George, all of Vt.

[73] Assignee: International Business Machines Corporation, Armonk, N.Y.

[21] Appl. No.: 518,515

[22] Filed: Aug. 23, 1995

[51] Int. Cl.$^6$ .................................................. G06F 9/455
[52] U.S. Cl. .......................... 395/500; 364/491; 364/488
[58] Field of Search ............................ 395/500; 364/488, 364/489, 490, 491

[56] References Cited

U.S. PATENT DOCUMENTS

| | | | |
|---|---|---|---|
| 4,786,154 | 11/1988 | Sliwkowski et al. | 364/468 |
| 4,849,904 | 7/1989 | Aipperspach et al. | 364/489 |
| 4,896,272 | 1/1990 | Kurosawa | 364/491 |
| 4,918,614 | 4/1990 | Modarres et al. | 364/490 |
| 4,939,668 | 7/1990 | Brown et al. | 364/513 |
| 4,940,908 | 7/1990 | Tran | 307/443 |
| 4,965,741 | 10/1990 | Winchell et al. | 364/513 |
| 5,003,487 | 3/1991 | Drumm et al. | 364/489 |
| 5,111,413 | 5/1992 | Lazansky et al. | 364/578 |
| 5,220,512 | 6/1993 | Watkins et al. | 364/489 |
| 5,225,991 | 7/1993 | Dougherty | 364/491 |
| 5,237,514 | 8/1993 | Curtin | 364/490 |
| 5,251,147 | 10/1993 | Finnerty | 364/490 |
| 5,297,053 | 3/1994 | Pease et al. | 364/474.24 |
| 5,341,308 | 8/1994 | Mendel | 364/489 |
| 5,598,344 | 1/1997 | Dangelo et al. | 364/489 |
| 5,623,418 | 4/1997 | Rostoker et al. | 364/578 |

Primary Examiner—Kevin J. Teska
Assistant Examiner—Matthew Clay Loppnow
Attorney, Agent, or Firm—Heslin & Rothenberg, P.C.

[57] ABSTRACT

In a Field Programmable Gate Array ("FPGA") design system, a configuration is generated. A path of the configuration is selected as a critical path for optimization. The critical path is optimized by rerouting connections between the logical primitives of the critical path. Prior to the rerouting, the logical primitives of the critical path may be optimally placed within the FPGA configuration. Optimal performance of the critical path is thus achieved.

9 Claims, 3 Drawing Sheets

OPTIMIZE PLACEMENT/ROUTE

OPTIMIZE ROUTE

METHOD AND SYSTEM FOR OPTIMIZING A CRITICAL PATH IN A FIELD PROGRAMMABLE GATE ARRAY CONFIGURATION

TECHNICAL FIELD

The present invention relates in general to the generation of configurations for programmable integrated circuit devices having multiple programmable logic cells and a programmable interconnection network. More specifically, the present invention relates to a method and system for optimizing a critical circuit path within a configuration of a field programmable gate array ("FPGA").

BACKGROUND OF THE INVENTION

Programmable integrated circuits are known in the art and include programmable logic devices ("PLDs"), Programmable Array Logic ("PALs"), and Programmable Logic Arrays ("PLAs"). Each of these programmable circuits provides an input AND logic plane followed by an OR logic plane. An output function which is the sum of the products of the input terms can thus be calculated. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is usually provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and the wiring network occurs when adding the final layers of metallization to an integrated circuit. A modified approach involves the use of laser-directed energy to customize the metallization pattern. Another such array is a Field Programmable Gate Array ("FPGA") in which the programming can be performed by a user, in the "field". Such programming may be effected by using electrically programmable fusible links, antifuses, memory-controlled transistors, or floating-gate transistors. All of the above-discussed types of programmable logic integrated circuits are referred to herein as "programmable arrays."

In a typical FPGA design cycle, the designer must implement many different logic paths (i.e., "circuits") which have differing timing requirements. To meet these timing requirements, conventional FPGA design software allows the designer to designate the timing requirements for different paths. Although many different routing strategies are employed in an attempt to meet all of the timing requirements, complete success is not often achieved. The final result is typically an FPGA configuration in which none of the paths have been routed optimally due to compromises made during the routing of each individual path in an attempt to meet its timing constraint. Some paths may not even meet their timing requirements due to contention with other paths for FPGA logic resources.

Although the heuristic algorithms which perform placing and routing for FPGA logic circuits have been improving, the problem is intractable. Often there is no way to provide the desired timing to the circuits defined in the FPGA. Thus, a designer typically has no way to guarantee that certain critical paths meet a predetermined timing requirement.

One method that has been used to optimize a critical path is to provide the designer the ability to manually move paths to different FPGA resources in order to achieve the timing goals. Such a method is very time consuming, tedious and difficult. The present invention is directed towards providing a method and system whereby the designer can achieve a better timing solution.

SUMMARY OF THE INVENTION

In a first aspect, the present invention comprises a computer implemented method for creating an optimized configuration for a field programmable gate array ("FPGA") from a logic design. The method includes automatically generating a nonoptimized configuration from the logic design using an automated place and route ("APR") technique. A critical path is then designated within the nonoptimized configuration for optimization. Thereafter, the optimized configuration is automatically generated to optimize the critical path.

As an enhancement, the optimization of the critical path may include rerouting and/or replacing the critical path. In regard to rerouting, the critical path may have multiple logic primitives, each having an input pin and an output pin. Rerouting the critical path may comprise rerouting each logic primitive by rerouting connections between the input pin and the output pin of each logic primitive of the multiple logic primitives of the critical path.

During rerouting, a connection corresponding to a path other than the critical path may be displaced. In such a case the method may include rerouting the path other than the critical path to replace the displaced connection.

If the critical path is replaced, the replacing may comprise displacing logic primitives corresponding to paths other than the critical path. Then, the displaced logic primitives may be replaced with free logic primitives within the FPGA.

As further enhancements, after the rerouting of the critical path, the method may include fixing the critical path in the nonoptimized configuration and using APR to generate the optimized configuration while maintaining the fixed critical path.

Other aspects of the present invention include a system for implementing the techniques disclosed herein, and a computer program product for implementation of the techniques disclosed herein.

The present invention has many advantages and features associated with it. The optimization of a critical path within an FPGA configuration provides optimal timing performance for the critical path. Furthermore, the timing characteristics of other paths are observable after optimization of the critical path. This enables a designer to not only optimize the critical path, but to observe the effect of such optimization on other FPGA circuits. By automating the optimization of the critical path, the conventional techniques of manually rerouting and replacing the logic primitives of a critical path are eliminated. This represents a savings in time which translates into an economic savings with regard to the design process. Furthermore, with the ever increasing complexity of FPGA technology, optimization of certain complex critical paths may not even be possible using prior manual techniques. Thus, the techniques disclosed herein represent an advancement in the field of FPGA configuration design.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

DESCRIPTION OF THE PREFERRED EMBODIMENT(S)

The present invention facilitates the optimization of a critical path within an FPGA design. To summarize after conventional automatic placement and routing ("APR") has been performed, a designer is presented with the timing delays of designated circuit paths. The designer may select a critical path that has a timing slower than its target timing and request automatic optimization of this path. Other paths are then rerouted/replaced to avoid the logic resources used by the optimized critical path. Thereafter, the designer is presented with an optimal performance for the critical path, and with the timing effect on other paths. In accordance therewith, the viability of the optimal routing of the critical path is evaluated.

Figure 1:
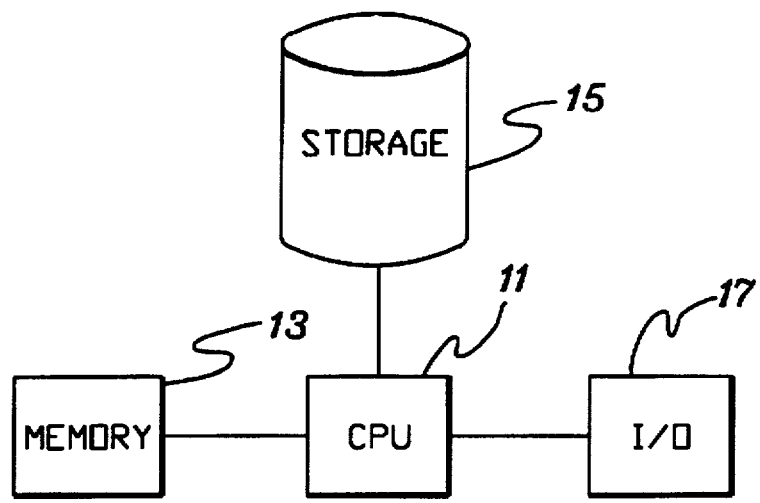
FIG. 1 is a block diagram of a computer system used in implementing the principles of the present invention.

The hardware elements of a design system used to implement the techniques of the present invention are shown in FIG. 1. A central processing unit ("CPU") 11 provides main processing functionality for the design system. A memory 13 is coupled to CPU 11 for providing operational storage of programs and data. Memory 13 may comprise, for example, random access memory ("RAM") or read only memory ("ROM"). Non-volatile storage of, for example, data files and programs is provided by a storage 15 that may comprise, for example, disk storage. Both memory 13 and storage 15 comprise a computer useable medium that may store computer program products in the form of computer readable program code. User input and output is provided by an input/output ("I/O") facility 17. I/O facility 17 may include, for example, a graphical display, a mouse and/or a graphics tablet. As an example, the design system of FIG. 1 may comprise an International Business Machines RISC System/6000 computer executing an AIX operating system and Cadence Figaro FPGA design software.

Figure 2:
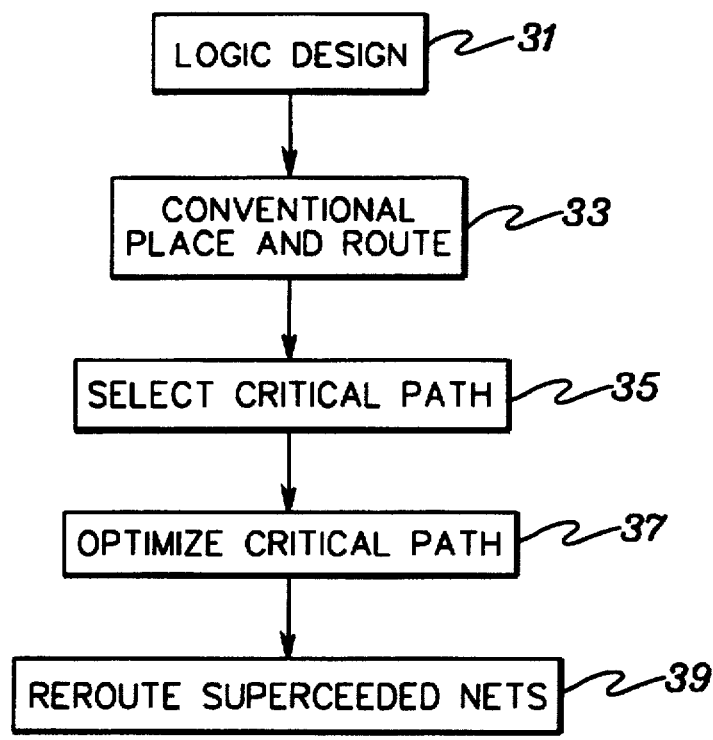
FIG. 2 is a flow diagram of an FPGA design process in conformance with one embodiment of the present invention.

A method for generating an FPGA configuration in accordance with the techniques of the present invention is shown in FIG. 2. The term "configuration" is used herein to refer to the programming state for the programmable resources within the FPGA including, for example, the programmable logic cells and programmable interconnect network. The method begins with the production of a schematic or boolean description of the needed logic functions for the FPGA (31). A net list is then created based upon the schematic or boolean description. Conventional APR is then performed according to the net list (33). An example of conventional APR is described in the publication entitled "FIELD-PROGRAMMABLE GATE ARRAYS" by S. Brown, R. Francis, J. Rose and Z. Vranesic, Kluwer Academic Publishers, 1992 which is hereby incorporated by reference herein in its entirety.

After APR, the designer selects a path for optimization that is referred to herein as a "critical path" (35). The critical path comprises multiple logic primitives and selection of the path may be made by, for example, selecting the individual logic primitives of the critical path. This type of selection feature preexists on conventional FPGA design tools for editing functions and may be used as the critical path selection tool discussed herein. As used herein, the term "logic primitives" refers to elemental functional logic units that a designer combines to create a desired logic function. Examples of logic primitives include adders, gates, multiplexers, flip-flops, and shift registers.

Figure 6:
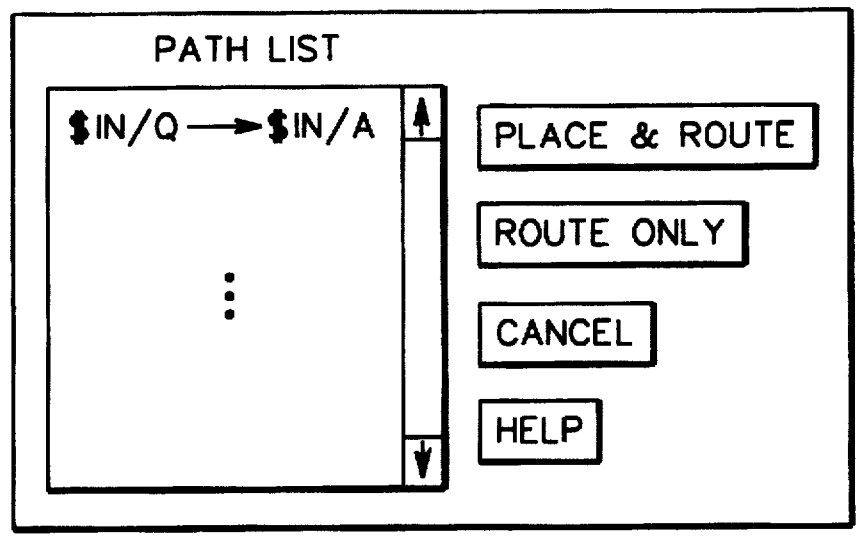
FIG. 6 is a select path dialog box pursuant to one embodiment of the present invention.

As an alternative path selection technique, a path optimization "pop-up" dialog box may be displayed (FIG. 6) that contains a list of paths within the FPGA configuration and allows selection of one of the displayed paths as the critical path. The displayed list of paths may include timing data determined during simulation of the FPGA configuration generated during APR. Such simulation is conventionally performed in FPGA design systems. If a critical path has been previously selected by selecting its individual logic primitives, the selected critical path is pre-selected when the path optimization pop-up dialog box is displayed.

After selection, the critical path is optimized. (FIG. 2, 37). This optimization may be achieved by rerouting connections between, or replacing, logic primitives used by the critical path within the FPGA layout. Both rerouting and replacing will be described in further detail hereinbelow.

Logic resources (e.g., logic primitives and routing resources) associated with paths other than the critical path may be displaced during the optimization of the critical path. This displacement results if a logic resource required to optimize the critical path is already used by another path. The critical path is given priority and is assigned the logical resource which is taken away from the path that previously used it. To remedy any paths with displaced resources, APR is again performed; however, the critical path is "fixed" in place such that its logic resources remain undisturbed (39).

Figure 3:
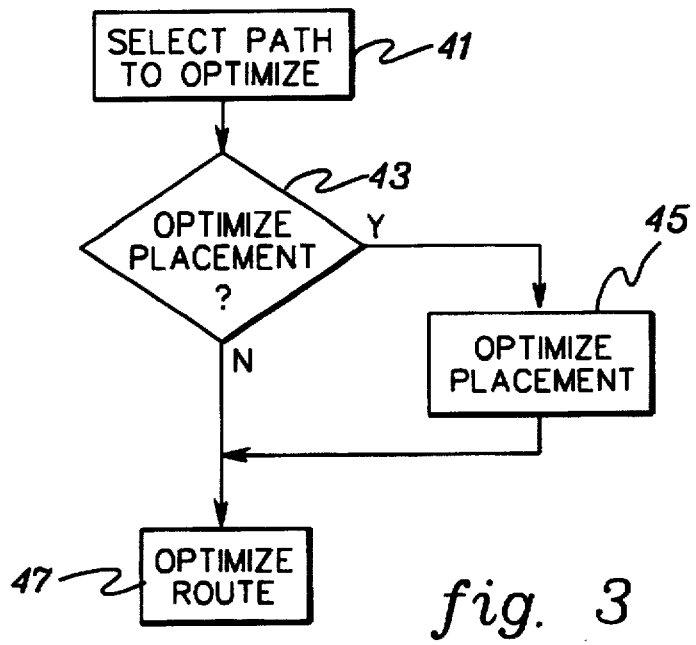
FIG. 3 is a flow diagram of a method used to optimize placement and routing of a path in an FPGA configuration according to an embodiment of the present invention.

Optimizing the critical path may include optimizing the placement of its logic primitives within the FPGA layout (i.e., "replacing"), optimizing the routing of signals between its logic primitives (i.e., "rerouting"), or both (FIG. 3). As one example process, a critical path is selected for optimization (41). Thereafter, a decision is made whether to optimize placement (43). If placement is to be optimized (45), logic primitives for the critical path are replaced within the FPGA layout so as to minimize signal latency along the critical path. This may comprise, for example, placing the logic primitives close together. Regardless of whether placement is optimized or not, routing is optimized (47). During rerouting, the connections within the routing matrix of the FPGA are optimized for the placed logic primitives of the critical path. The rerouting may comprise, for example, selecting the shortest possible routes.

Figure 4:
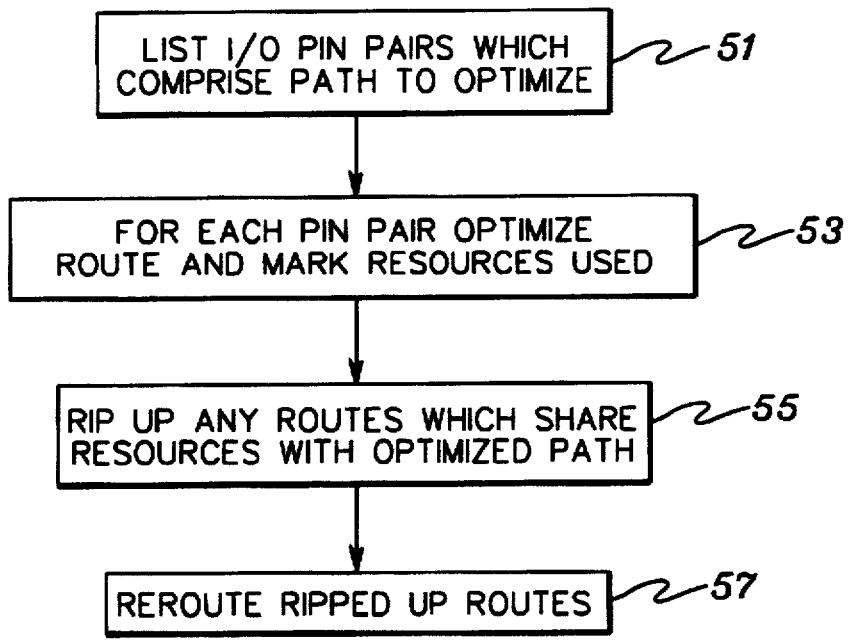
FIG. 4 is a flow diagram of a method used to optimize routing of a path in an FPGA pursuant to one embodiment of the present invention.

One process for optimizing a route is shown in the flow diagram of FIG. 4. The logic primitives of the critical path are connected together such that an output of one primitive is connected to the input of a succeeding primitive. The inputs and outputs of these primitive are referred to herein as "pins." Optimization of the routing of the critical path is performed by optimizing the routing between the pins of each logic primitive within the critical path. That is, rerouting connections between and within each primitive.

As a first step in the optimized routing of the critical path, a list of the logical primitives that comprise the critical path and their input and output pins is created (51). For each input/output pin pair, the route between the input pin and output pin is optimized (53). As each input/output route is optimized, it is marked as used and is thereafter not useable by another logic primitive. The optimization of the routes for each input/output pin pair results in an optimization of routing for the entire critical path. During routing, the primitives may be traversed in an order corresponding to the order with which a signal passes through the logic primitives of the critical path.

During the routing optimization discussed above, routing resources may be used that are also used by other (i.e., non-critical) paths. The routing resources associated with these other paths are removed (i.e. "ripped up"-55). Thereafter, the paths with "ripped-up" routes are rerouted using available routing resources (57).

In the foregoing embodiments, routing may be performed using one of many conventional techniques. As one example, an A* maze router may be used. The particular A* implementation should include a term which prevents reuse of the resources consumed by the critical path. Reference is made herein to the description of the A* maze router in "An Architecture—Adaptive Performance Driven Router for FPGAs," by McMurchie, Ebeling and Borriello, University of Washington Technical Report #94-05-01, published May 1, 1994, which is incorporated by reference herein in its entirety.

Figure 5:
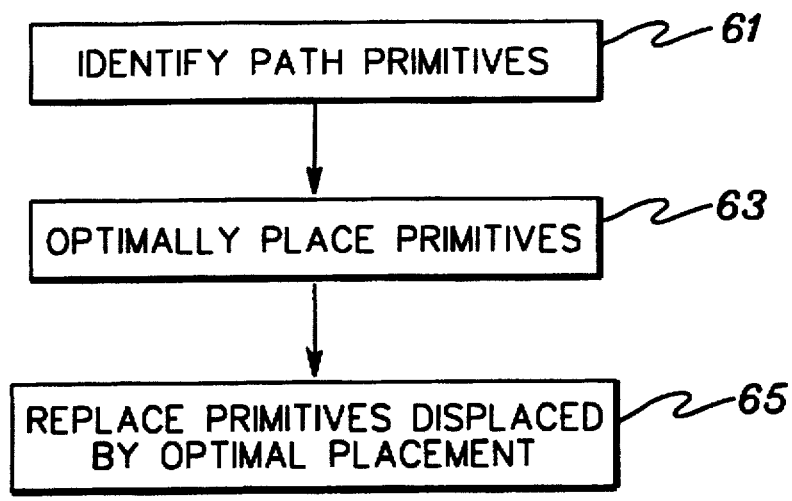
FIG. 5 is a flow diagram of a method used to optimize placement of the logic primitives of a path in an FPGA according to an embodiment of the present invention.

As discussed hereinabove, prior to rerouting of the critical path, the logical primitives associated therewith may be optimally placed in the FPGA (FIG. 5). An optimized placement begins with the identification of the critical path's logic primitives (step 61). These identified logic primitives are optimally placed within the FPGA using a conventional placement technique (63). Reference is made herein to a simulated annealing placement technique as described in, for example, "A sea-of-gates style FPGA Placement Algorithm," by Roy, Guan and Sechen, 7th International Conference on VLSI Design, January 1994, IEEE publication number 0-8186-4990-9/94, which is incorporated by reference herein in its entirety.

It is possible that logic primitives associated with paths other than the critical path may be displaced during optimal placement of the logic primitives associated with the critical path. Therefore, these logic primitives are replaced (65) within the FPGA. The placed primitives associated with the critical path are fixed (i.e., protected) such that they are not used during the re-placement of displaced logic primitives. As discussed hereinabove, a routing step follows the placement discussed herein such that complete APR is performed for the FPGA. An optimally placed and routed critical path accordingly results.

To summarize, the present invention has many advantages and features associated with it. The optimization of a critical path within an FPGA configuration provides optimal timing performance for the critical path. Furthermore, the timing characteristics of other paths are observable after optimization of the critical path. This enables a designer to not only optimize the critical path, but to observe the effect of such optimization on other FPGA circuits. By automating the optimization of the critical path, the conventional techniques of manually rerouting and replacing the logic primitives of a critical path are eliminated. This represents a savings in time which translates into an economic savings with regard to the design process. Furthermore, with the ever increasing complexity of FPGA technology, optimization of certain complex critical paths may not even be possible using prior manual techniques. Thus, the techniques disclosed herein represent an advancement in the field of FPGA configuration design.

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

We claim:

1. A computer implemented method for creating an optimized configuration for a field programmable gate array ("FPGA") from a logic design, said method comprising the steps of:

(a) automatically generating a nonoptimized configuration from the logic design using an automated place and route ("APR") technique;

(b) designating a critical path within the nonoptimized configuration for optimization, wherein said critical path comprises multiple logic primitives, said designating comprising manually identifying individual FPGA logic primitives within the nonoptimized configuration that define said critical path;

(c) fixing said critical path in said nonoptimized configuration and using APR to generate the optimized configuration while maintaining said fixed critical path; and (d) automatically generating the optimized configuration to optimize said critical path, wherein each of said multiple logic primitives has an input pin and an output pin, and wherein said automatically generating comprises rerouting each logic primitive by rerouting connections between said input pin and said output pin of each logic primitive of said multiple logic primitives.

2. The method of claim 1, wherein said step (d) comprises rerouting said multiple logic primitives of said critical path one logic primitive of said multiple logic primitives at a time, in an order defined by an order in which an electrical signal would traverse said multiple logic primitives of said critical path.

3. The method of claim 1, wherein said step (d) comprises rerouting said critical path, said rerouting displacing a connection corresponding to a path other than said critical path, said method further including rerouting said path other than said critical path to replace said displaced connection.

4. A computer implemented method for creating an optimized configuration for a field programmable gate array ("FPGA") from a logic design, said method comprising the steps of:

(a) automatically generating a nonoptimized configuration from the logic design using an automated place and route ("APR ") technique;

(b) designating a critical path within the nonoptimized configuration for optimization;

(c) automatically generating the optimized configuration to optimize said critical path, wherein said critical path comprises multiple logic primitives, and wherein said automatically generating comprises replacing at least one of said multiple logic primitives, said replacing comprising displacing a logic primitive corresponding to a path other than said critical path; and (d) replacing said displaced logic primitive with a free logic primitive within the FPGA.

5. A computer system for creating an optimized configuration for a field programmable gate array ("FPGA") from a logic design, said system comprising:

means for automatically generating a nonoptimized configuration from the logic design using an automated place and route ("APR") technique;

means for designating a critical path within the nonoptimized configuration for optimization, wherein said critical path comprises multiple logic primitives, and wherein said means for designating comprises means for manually identifying individual FPGA logic primitives within the nonoptimized configuration that define said critical path;

means for automatically generating the optimized configuration to optimize said critical path, wherein each of said multiple logic primitives has an input pin and an output pin, wherein said means for automatically generating comprises means for rerouting connections between said input pin and said output pin of each logic primitive of said multiple logic primitives;

means for fixing said critical path in said nonoptimized configuration; and

APR means for generating the optimized configuration while maintaining said fixed critical path.

6. The system of claim 5, wherein a signal traverses a critical path in a predefined order, and wherein said means for rerouting comprises means for rerouting said multiple logic primitives of said critical path one logic primitive of said multiple logic primitives at a time, in said predefined order.

7. The system of claim 5, wherein said means for rerouting displaces a connection corresponding to a path other than said critical path, said system further including means for rerouting said path other than said critical path to replace said displaced connection.

8. A computer system for creating an optimized configuration for a field programmable gate array ("FPGA") from a logic design, said system comprising:

means for automatically generating a nonoptimized configuration from the logic design using an automated place and route ("APR") technique;

means for designating a critical path within the nonoptimized configuration for optimization;

means for automatically generating the optimized configuration to optimize said critical path, wherein said critical path comprises multiple logic primitives, and wherein said means for replacing comprises means for replacing at least one of said multiple logic primitives, said replacing comprising displacing a logic primitive corresponding to a path other than said critical path; and means for replacing said displaced logic primitive with a free logic primitive within the FPGA.

9. A computer program product comprising a computer useable medium having computer readable program code means therein for causing an optimized configuration for a field programmable gate array ("FPGA") to be created from a logic design, said computer readable program code means in said computer program product comprising:

computer readable program code means for causing a computer to affect automatically generating a nonoptimized configuration from the logic design using an automated place and route ("APR") technique;

computer readable program code means for causing a computer to affect designating a critical path within the nonoptimized configuration for optimization, wherein said critical path comprises multiple logic primitives, said designating comprising manually identifying individual FPGA logic primitives within the nonoptimized configuration that define said critical path;

computer readable program code means for causing a computer to affect fixing said critical path in said nonoptimized configuration and using APR to generate the optimized configuration while maintaining said fixed critical path; and computer readable program code means for causing a computer to affect automatically generating the optimized configuration to optimize said critical path, wherein each of said multiple logic primitives has an input pin and an output pin, and wherein said automatically generating comprises rerouting each logic primitive by rerouting connections between said input pin and said output pin of each logic primitive of said multiple logic primitives.

* * * * *